(12) United States Patent
Yamada et al.

(10) Patent No.: US 11,196,101 B2
(45) Date of Patent: Dec. 7, 2021

(54) BATTERY DISCHARGE CONTROLLER

(71) Applicant: TOYOTA JIDOSHA KABUSHIKI KAISHA, Toyota (JP)

(72) Inventors: Reina Yamada, Toyota (JP); Koji Murakami, Toyota (JP); Ken Yoshida, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 230 days.

(21) Appl. No.: 16/397,316

(22) Filed: Apr. 29, 2019

(65) Prior Publication Data

US 2019/0363406 A1 Nov. 28, 2019

(30) Foreign Application Priority Data

May 25, 2018 (JP) .............................. JP2018-100739

(51) Int. Cl.
*H01M 10/44* (2006.01)
*H02J 7/14* (2006.01)
(Continued)

(52) U.S. Cl.
CPC ......... *H01M 10/441* (2013.01); *B60R 16/033* (2013.01); *G01R 31/382* (2019.01);
(Continued)

(58) Field of Classification Search
CPC .. H01M 10/441; H01M 10/425; H01M 10/44; H01M 2220/20; H01M 2010/4271;
(Continued)

(56) References Cited

U.S. PATENT DOCUMENTS 6,630,810 B2 * 10/2003 Takemasa ............... B60L 58/10
320/104
6,639,384 B2 * 10/2003 Hasegawa ............. H02J 7/1423
320/126

(Continued)

FOREIGN PATENT DOCUMENTS

JP 2009-261091 11/2009
WO WO2010/140253 A1 12/2010

*Primary Examiner* — Helen Rossoshek
(74) *Attorney, Agent, or Firm* — Oblon, McClelland, Maier & Neustadt, L.L.P.

(57) ABSTRACT

A battery discharge controller configured to control a hybrid system having first and second batteries includes a charged electric charge amount calculating section and a discharge controlling section. The discharge controlling section controls the DC/DC converter such that the first battery and the second battery are both discharged when a first reserve electric charge amount, which is a value obtained by subtracting a predetermined first lower limit electric charge amount from the charged electric charge amount of the first battery, has a positive value, a second reserve electric charge amount, which is a value obtained by subtracting a predetermined second lower limit electric charge amount from the charged electric charge amount of the second battery, has a positive value, and an absolute value of a difference between the first reserve electric charge amount and the second reserve electric charge amount is less than a predetermined threshold.

4 Claims, 4 Drawing Sheets

(51) Int. Cl.
*H02J 7/00* (2006.01)
*H01M 10/42* (2006.01)
*B60R 16/033* (2006.01)
*G01R 31/382* (2019.01)

(52) U.S. Cl.
CPC ......... *H01M 10/425* (2013.01); *H02J 7/0063* (2013.01); *H02J 7/14* (2013.01); *H01M 2220/20* (2013.01)

(58) Field of Classification Search
CPC ......... Y02T 10/62; Y02T 10/70; Y02T 90/14; Y02T 10/40; Y02T 10/84; Y02T 10/92; B60W 10/08; B60W 20/00; B60W 2510/244; B60W 50/61; H02J 7/14; H02J 1/082; H02J 7/34; H02J 7/342; H02J 2310/48; H02J 7/00306; H02J 7/00712; H02J 7/0025; H02J 7/0048; B60R 16/033; H02M 3/33584; G01R 31/382; Y02E 60/10; B60L 58/12; B60L 2210/10; B60L 58/14; B60L 58/13; B60L 15/20
See application file for complete search history.

(56) References Cited

U.S. PATENT DOCUMENTS

| | | | | |
|---|---|---|---|---|
| 7,053,500 B2 * | 5/2006 | Furukawa | ............... | B60L 58/20 307/10.6 |
| 7,477,038 B2 * | 1/2009 | Taniguchi | ............... | B60L 58/20 320/104 |
| 7,766,788 B2 * | 8/2010 | Shamoto | ............... | B60W 10/06 477/3 |
| 7,884,574 B2 * | 2/2011 | Fukumura | ............... | B60W 10/08 320/130 |
| 8,154,152 B2 * | 4/2012 | Kojima | ................ | H02M 3/158 307/45 |
| 8,174,241 B2 * | 5/2012 | Kojima | ................... | B60L 58/10 320/134 |
| 8,410,755 B2 * | 4/2013 | Chau | ................... | B60L 11/1851 320/118 |
| 8,508,067 B2 * | 8/2013 | Song | ......................... | B60L 3/04 307/9.1 |
| 8,575,897 B2 * | 11/2013 | Masuda | ................ | H02J 7/1461 320/134 |
| 8,718,854 B2 * | 5/2014 | Hashimoto | ............ | B60K 6/445 701/22 |
| 8,818,603 B2 * | 8/2014 | Kinoshita | ............. | B60W 20/00 701/22 |
| 8,914,178 B2 * | 12/2014 | Yamazaki | ............. | B60K 6/442 701/22 |
| 9,233,613 B2 * | 1/2016 | Kusumi | ................... | H02J 7/14 |
| 9,248,827 B2 * | 2/2016 | Kamatani | ............. | B60W 10/24 |
| 9,413,256 B2 * | 8/2016 | Tamura | ................ | B60L 15/2045 |
| 9,493,091 B2 * | 11/2016 | Kim | ......................... | B60L 58/12 |
| 9,663,098 B2 * | 5/2017 | Kodawara | ................ | B60L 58/20 |
| 10,647,202 B2 * | 5/2020 | Nishimura | ............ | B60L 50/16 |
| 2010/0244782 A1 * | 9/2010 | Nagayama | ............ | H02J 7/0032 320/162 |
| 2012/0143425 A1 | 6/2012 | Yamamoto et al. | | |
| 2014/0343877 A1 * | 11/2014 | Kimura | ................. | H02J 7/0068 702/63 |
| 2015/0270731 A1 * | 9/2015 | Adelmann | ............ | H02J 7/0003 320/101 |
| 2015/0336468 A1 * | 11/2015 | Sugiyama | ............... | B60L 58/21 701/22 |
| 2016/0089981 A1 * | 3/2016 | Kodawara | ............... | B60L 50/40 307/10.1 |
| 2016/0193940 A1 * | 7/2016 | Tashiro | ............... | B60L 11/1868 701/22 |
| 2016/0229411 A1 * | 8/2016 | Murata | ................ | B60L 58/12 |
| 2016/0236581 A1 * | 8/2016 | Tashiro | ................ | H02J 7/0091 |
| 2017/0008408 A1 * | 1/2017 | Park | ........................ | B60L 58/20 |
| 2018/0354370 A1 * | 12/2018 | Horii | ...................... | B60K 6/485 |
| 2019/0070972 A1 * | 3/2019 | Lee | .......................... | B60K 6/48 |
| 2019/0135269 A1 * | 5/2019 | Suzuki | ..................... | B60K 6/48 |

\* cited by examiner

BATTERY DISCHARGE CONTROLLER

BACKGROUND

1. Field

The present disclosure relates to a battery discharge controller that is configured to control a hybrid system.

2. Description of Related Art

The hybrid system disclosed in Japanese Laid-Open Patent Publication No. 2009-261091 includes an engine as a drive source and a motor generator drivably coupled to the engine. The motor generator is connected to a high-voltage battery. When the motor generator functions as a motor, the high-voltage battery supplies power to the motor generator. When the motor generator functions as a generator, the motor generator supplies power to the high-voltage battery. The motor generator and the high-voltage battery are also connected to a low-voltage battery via a DC/DC converter. Further, the DC/DC converter and the low-voltage battery are connected to electrical auxiliary devices such as audio systems and lights. The auxiliary devices receive power from the DC/DC converter and the low-voltage battery. In the above-described hybrid system, when the charged amount of the high-voltage battery is greater than or equal to a predetermined amount, the DC/DC converter is controlled such that the auxiliary devices receive power from the high-voltage battery via the DC/DC converter.

In the above-described hybrid system, the power of the high-voltage battery is preferentially discharged until the charged amount of the high-voltage battery becomes less than the predetermined amount. Thus, when the motor generator functions as a generator, the charged amount of the high-voltage battery is likely to have been reduced accordingly. Therefore, the charged amount of the high-voltage battery is unlikely to be so high that the power generated by the motor generator cannot be supplied to the high-voltage battery.

However, even if the discharge control of a high-voltage battery such as that in the above-described hybrid system is attempted, the amount of power with which the high-voltage battery can be charged is small in a case in which the maximum electric charge amount with which the high-voltage battery can be charged, that is, the fully charged electric charge amount of the high-voltage battery is small. Therefore, there is a need for a technology that is capable of effectively utilizing power generated by a motor generator even if the fully charged electric charge amount of a high-voltage battery is small.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a battery discharge controller configured to control a hybrid system is provided. The hybrid system includes an engine as a drive source, a motor generator that is drivably coupled to the engine, a first battery that receives power from the motor generator, and a second battery that is connected to the motor generator and the first battery via a bidirectional DC/DC converter. The battery discharge controller includes a charged electric charge amount calculating section and a discharge controlling section. The charged electric charge amount calculating section is configured to calculate a charged electric charge amount of the first battery and a charged electric charge amount of the second battery. The discharge controlling section is configured to control the DC/DC converter so as to discharge at least one of the first battery and the second battery when conditions are met. One of the conditions is that the motor generator is in a stopped state or the motor generator is discharging. The discharge controlling section is configured to control the DC/DC converter to discharge both of the first battery and the second battery when a first reserve electric charge amount, which is a value obtained by subtracting a predetermined first lower limit electric charge amount from the charged electric charge amount of the first battery, has a positive value, a second reserve electric charge amount, which is a value obtained by subtracting a predetermined second lower limit electric charge amount from the charged electric charge amount of the second battery, has a positive value, and an absolute value of a difference between the first reserve electric charge amount and the second reserve electric charge amount is less than a predetermined threshold.

With the above-described configuration, if the absolute value of the difference between the first reserve electric charge amount of the first battery and the second reserve electric charge amount of the second battery is less than the threshold, the first battery and the second battery are both discharged. Thus, if the motor generator generates power afterward, the charged electric charge amount of not only either one of the first battery and the second battery, but also the charged electric charge amount of the other battery will have been reduced, so that the generated power can be supplied to both batteries. That is, both batteries are used effectively as supply destinations of the power generated by the motor generator.

In the above-described configuration, the discharge controlling section may be configured to control the DC/DC converter based on a comparison between the first reserve electric charge amount and the second reserve electric charge amount such that more power is discharged from one of the first and second batteries that has more electric charge amount that can be output.

There may be a difference between the maximum electric charge amount with which the first battery can be charged and the maximum electric charge amount with which the second battery can be charged. Even in such a case, when the first battery and the second battery are both discharged, the above-described configuration prevents the charged electric charge amount of one of the batteries from falling to the lower limit electric charge amount more quickly than the other battery.

In the above-described configuration, the discharge controlling section may be configured to control the DC/DC converter such that, if discharge from both of the first battery and the second battery is continued, a point in time at which the charged electric charge amount of the first battery reaches the first lower limit electric charge amount is at the same time as a point in time at which the charged electric charge amount of the second battery reaches the second lower limit electric charge amount.

With the above-described configuration, when the first battery and the second battery continue to be discharged, the charged electric charge amounts of the batteries reach the respective lower limit electric charge amounts substantially simultaneously. In this state, the sum of the electric charge amounts with which the batteries are charged by the motor generator is maximized. This allows the power generated by the motor generator to be used more effectively.

In the above-described configuration, the discharge controlling section may be configured to control the DC/DC converter such that, if the first reserve electric charge amount and the second reserve electric charge amount have positive values, and the absolute value of the difference between the first reserve electric charge amount and the second reserve electric charge amount is greater than or equal to the threshold, one of the first and second batteries that has a greater reserve electric charge amount is discharged, and one of the first and second batteries that has a smaller reserve electric charge amount is not discharged. This configuration prevents the battery with a smaller reserve electric charge amount from being discharged, so the charged electric charge amount of that battery will not be excessively reduced.

In another aspect, a battery discharge controller configured to control a hybrid system is provided. The hybrid system includes an engine as a drive source, a motor generator that is drivably coupled to the engine, a first battery that receives power from the motor generator, and a second battery that is connected to the motor generator and the first battery via a bidirectional DC/DC converter. The battery discharge controller includes a charged electric charge amount calculating section and a discharge controlling section. The charged electric charge amount calculating section is configured to calculate a charged electric charge amount of the first battery and a charged electric charge amount of the second battery. The discharge controlling section is configured to control the DC/DC converter so as to discharge at least one of the first battery and the second battery when conditions are met. One of the conditions being that the motor generator is in a stopped state or the motor generator is discharging. The discharge controlling section is configured to control the DC/DC converter to alternately discharge the first battery and the second battery when a first reserve electric charge amount, which is a value obtained by subtracting a predetermined first lower limit electric charge amount from the charged electric charge amount of the first battery, has a positive value, a second reserve electric charge amount, which is a value obtained by subtracting a predetermined second lower limit electric charge amount from the charged electric charge amount of the second battery, has a positive value, and an absolute value of a difference between the first reserve electric charge amount and the second reserve electric charge amount is less than a predetermined threshold.

With the above-described configuration, if the difference between the first reserve electric charge amount of the first battery and the second reserve electric charge amount of the second battery is less than the threshold, the first battery and the second battery are both alternately discharged. Thus, if the motor generator generates power afterward, the generated power is supplied not only to the first battery, but also to the second battery. That is, the second battery is used effectively as a supply destination of the power generated by the motor generator.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

A battery discharge controller according to an embodiment will now be described. The battery discharge controller is configured to control a hybrid system of a vehicle.

Figure 1:
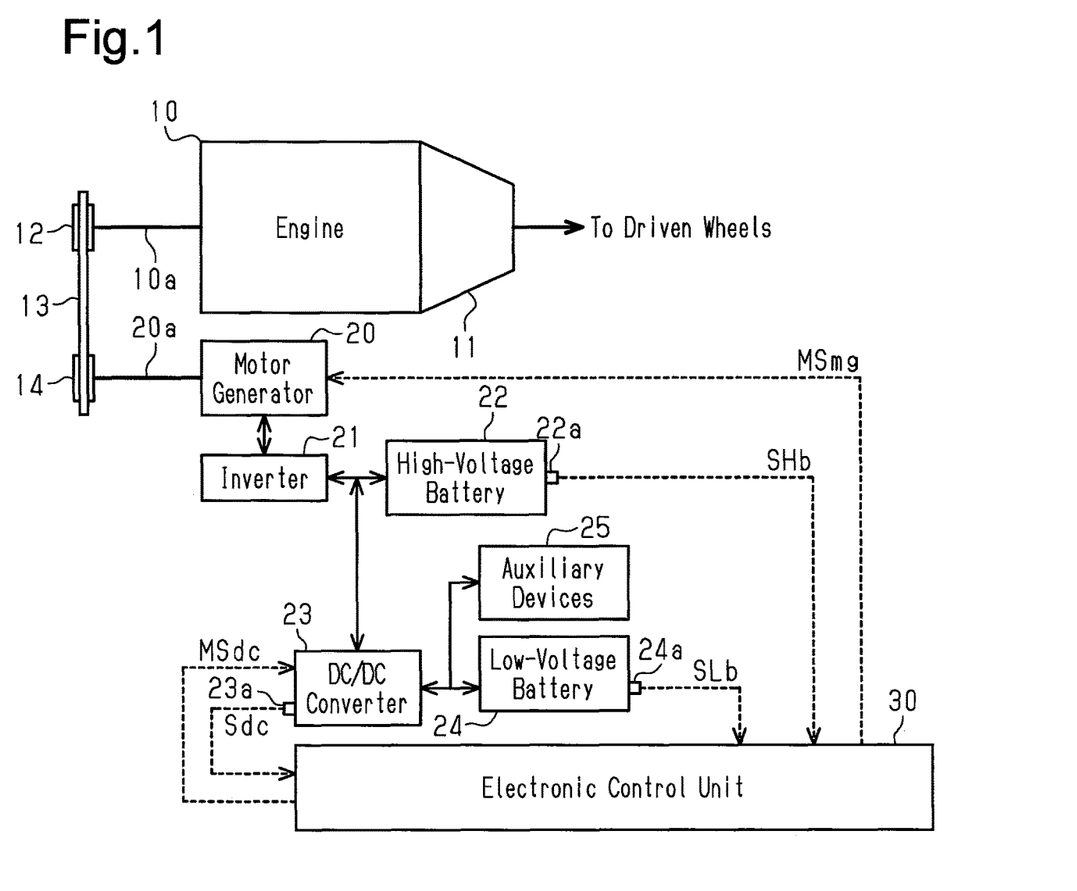
FIG. 1 is a schematic diagram of a hybrid system.

As shown in FIG. 1, the hybrid system has an engine 10 as the drive source of the vehicle. The engine 10 includes a crankshaft 10a that is drivably coupled to driven wheels via a transmission 11. The crankshaft 10a of the engine 10 is drivably coupled to a first pulley 12. A transmission belt 13 is looped over the first pulley 12. Although not illustrated, the crankshaft 10a of the engine 10 is also drivably coupled to a hydraulic pump that generates hydraulic pressure and the compressor of the air conditioner via a belt, pulleys, gears (sprockets), and a chain.

The hybrid system includes a motor generator 20 as a drive source separate from the engine 10. The motor generator 20 is what is called a three-phase alternating current electric motor. The motor generator 20 has an output shaft 20a that is drivably coupled to a second pulley 14. A transmission belt 13 is looped over the second pulley 14. That is, the motor generator 20 is drivably coupled to the crankshaft 10a of the engine 10 via the second pulley 14, the transmission belt 13, and the first pulley 12.

When functioning as an electric motor, the motor generator 20 applies a rotational torque to the second pulley 14, and the rotational torque is input to the crankshaft 10a of the engine 10 via the transmission belt 13 and the first pulley 12. That is, in this case, the motor generator 20 assists driving of the engine 10. In contrast, when the motor generator 20 functions as a generator, the rotational torque of the crankshaft 10a of the engine 10 is input to the output shaft 20a of the motor generator 20 via the first pulley 12, the transmission belt 13 and the second pulley 14. The motor generator 20 generates power in response to rotation of the output shaft 20a.

The motor generator 20 is connected to a first battery, which is a high-voltage battery 22, via an inverter 21. The inverter 21 is what is called a bidirectional inverter, and converts an AC voltage generated by the motor generator 20 into a DC voltage and outputs it to the high-voltage battery 22. The inverter 21 also converts the DC voltage output by the high-voltage battery 22 into an AC voltage and outputs it to the motor generator 20. Although FIG. 1 depicts the inverter 21 as a member separate from the motor generator 20, the inverter 21 may be incorporated in the housing of the motor generator 20.

The high-voltage battery 22 is a 48 V lithium ion battery. The high-voltage battery 22 supplies power to the motor generator 20 when the motor generator 20 functions as an electric motor. Further, the high-voltage battery 22 is charged by being supplied with power from the motor generator 20 when the motor generator 20 functions as a generator.

The high-voltage battery 22 incorporates a sensor section 22a that detects the state of the high-voltage battery 22. The sensor section 22a detects information such as the terminal-to-terminal voltage, the input current, and the temperature of the high-voltage battery 22, and outputs a signal indicating state information SHb of the high-voltage battery 22.

The motor generator 20 is connected to a DC/DC converter 23 via the inverter 21. The DC/DC converter 23 is also connected to the high-voltage battery 22. The DC/DC converter 23 is what is called a buck-boost converter (bidirectional converter). When functioning as a buck converter, the DC/DC converter 23 steps down the DC voltage output from the inverter 21 or the high-voltage battery 22 to 10 V to 15 V and outputs the stepped down voltage. When functioning as a boost converter, the DC/DC converter 23 steps up the DC voltage output from a low-voltage battery 24, which will be discussed below, to 45 V to 55 V and outputs the stepped up voltage.

The DC/DC converter 23 incorporates a sensor section 23a that detects the state of the DC/DC converter 23. The sensor section 23a detects information such as the output voltage and the output current of the DC/DC converter 23 and outputs a signal indicating state information Sdc of the DC/DC converter 23.

The DC/DC converter 23 is connected to a second battery, which is the low-voltage battery 24. The low-voltage battery 24 is a 12 V lead-acid battery of voltage smaller than that of the high-voltage battery 22. The low-voltage battery 24 outputs 12 V DC voltage when the DC/DC converter 23 is not driven or when the output voltage of the DC/DC converter 23 is 12 V. When the output voltage of the DC/DC converter 23 is higher than the open circuit voltage (OCV) of the low-voltage battery 24, the low-voltage battery 24 is charged by receiving power from the DC/DC converter 23.

The low-voltage battery 24 incorporates a sensor section 24a that detects the state of the low-voltage battery 24. The sensor section 24a detects information such as the terminal-to-terminal voltage, the input current, and the temperature of the low-voltage battery 24 and outputs a signal indicating state information SLb of the low-voltage battery 24.

Various types of electric auxiliary devices 25 are connected to the DC/DC converter 23 and the low-voltage battery 24. The auxiliary devices 25 include the starter of the engine 10, lights of the vehicle such as the headlights, the turn signals, and the interior lights, and interior devices such as a car navigation system and speakers. When the DC/DC converter 23 is not driven, the auxiliary devices 25 receive power from the low-voltage battery 24. When the output voltage of the DC/DC converter 23 is higher than the open circuit voltage (OCV) of the low-voltage battery 24, the auxiliary devices 25 receive power from the DC/DC converter 23.

As shown in FIG. 1, the hybrid system includes an electronic control unit 30 that controls, in a centralized manner, the entire hybrid system including discharge of the high-voltage battery 22 and discharge of the low-voltage battery 24. That is, the electronic control unit 30 functions as a discharge controller for the high-voltage battery 22 and the low-voltage battery 24. The electronic control unit 30 is processing circuitry (computer) that includes an arithmetic section that executes various programs (applications), a nonvolatile memory section in which programs are stored, a volatile memory in which pieces of data are temporarily stored when a program is executed.

The electronic control unit 30 receives the signal that indicates the state information Sdc from the sensor section 23a of the DC/DC converter 23. Based on the signal, the electronic control unit 30 acquires information such as the output voltage and the output current of the DC/DC converter 23.

The electronic control unit 30 receives the signal that indicates the state information SHb from the sensor section 22a of the high-voltage battery 22. The electronic control unit 30 calculates the charged electric charge amount and the fully charged electric charge amount of the high-voltage battery 22 based on information such as the terminal-to-terminal voltage, the input current, and the temperature of the high-voltage battery 22, which is included in the state information SHb. In the present embodiment, the charged electric charge amount of the high-voltage battery 22 is the electric charge amount stored in the high-voltage battery 22 at the point in time when the state information SHb is input and is expressed as, for example, ampere-second (A·s). Also, the fully charged electric charge amount is the maximum electric charge amount that can be stored in the high-voltage battery 22 at the point in time when the state information SHb is input and is expressed as, for example, ampere-second (A·s).

The electronic control unit 30 receives the signal that indicates the state information SLb from the sensor section 24a of the low-voltage battery 24. The electronic control unit 30 calculates the charged electric charge amount and the fully charged electric charge amount of the low-voltage battery 24 based on information such as the terminal-to-terminal voltage, the input current, and the temperature of the low-voltage battery 24, which is included in the state information SLb. Thus, the electronic control unit 30 functions as a charged electric charge amount calculating section that calculates information such as the charged electric charge amount of the high-voltage battery 22 and the charged electric charge amount of the low-voltage battery 24.

The electronic control unit 30 generates an operation signal MSdc for controlling the output voltage of the DC/DC converter 23 based on the charged electric charge amount of the high-voltage battery 22 and the charged electric charge amount of the low-voltage battery 24, which are calculated in the above-described manner, and outputs the operation signal MSdc to the DC/DC converter 23. Through control of the output voltage of the DC/DC converter 23, it is possible to control which of the high-voltage battery 22 and the low-voltage battery 24 will be discharged, and the amount of discharge. That is, the electronic control unit 30 functions as a discharge controlling section for the high-voltage battery 22 and the low-voltage battery 24.

Also, the electronic control unit 30 generates an operation signal MSmg for controlling the motor generator 20 based on signals from various types of sensors that detect the state of the engine 10, and outputs the operation signal MSmg to the motor generator 20. In accordance with the operation signal MSmg, the motor generator 20 functions as a motor (discharges), functions as a generator (generates power), or stops operating.

Figure 2:
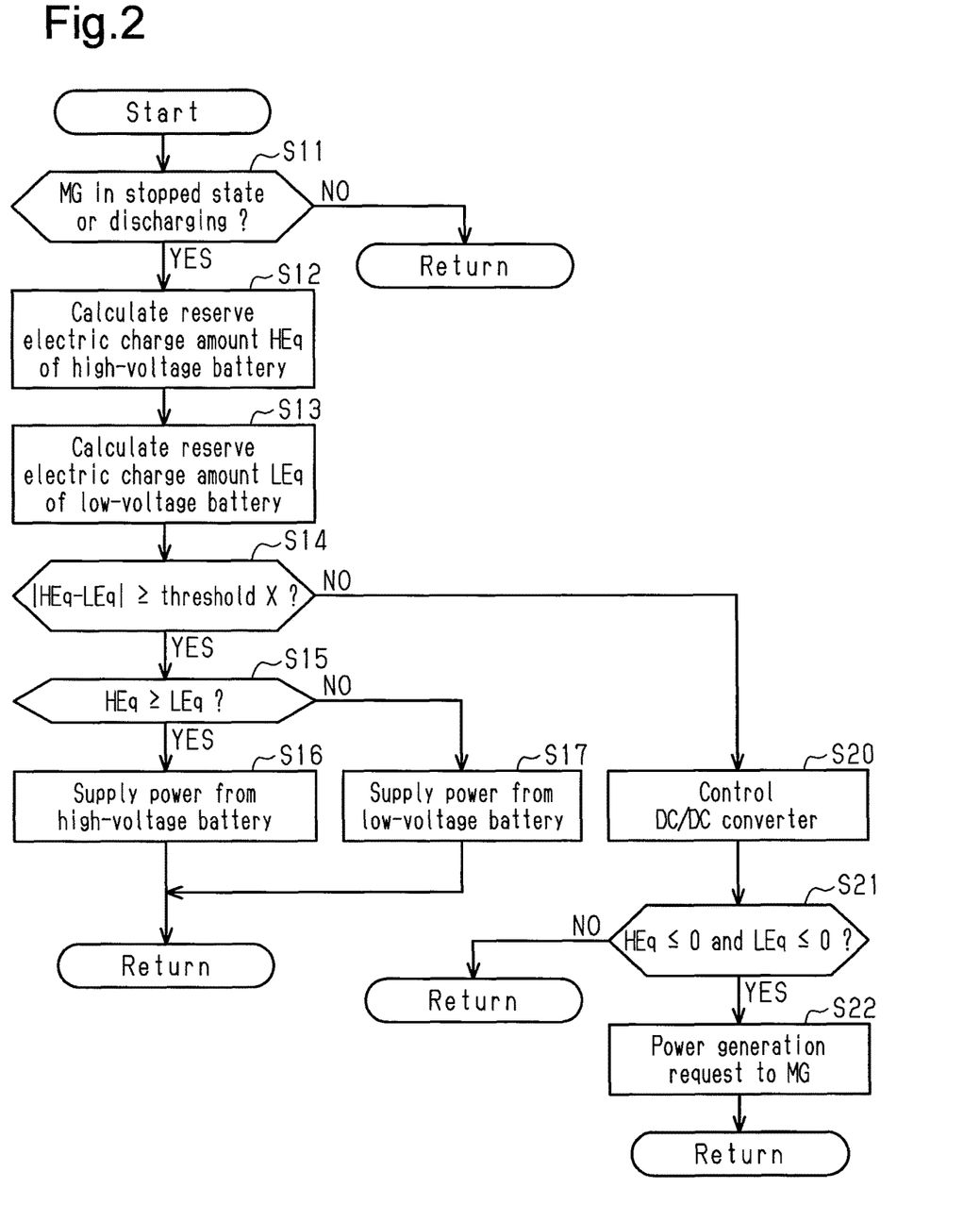
FIG. 2 is a flowchart of a battery discharge control process.

Next, the battery discharge control process executed by the electronic control unit 30 will be described with reference to FIG. 2. In the following description, the battery discharge control process is repeatedly executed at a predetermined control cycle when the charged electric charge amount of the high-voltage battery 22 is greater than a lower limit electric charge amount Lim1 and the charged electric charge amount of the low-voltage battery 24 is greater than a lower limit electric charge amount Lim2. That is, the battery discharge control process is executed in a situation that the high-voltage battery 22 and the low-voltage battery 24 are allowed to be discharged. The lower limit electric charge amount Lim1 for the high-voltage battery 22 and the lower limit electric charge amount Lim2 for the low-voltage battery 24 will be discussed below.

When the battery discharge control process is started, the electronic control unit 30 executes the process of step S11. In step S11, the electronic control unit 30 determines whether the motor generator 20 is generating power, being discharged, or in a stopped state based on the operation signal MSmg output to the motor generator 20. If it is determined that the motor generator 20 is generating power (NO in step S11), the high-voltage battery 22 and the low-voltage battery 24 are not in a situation of being discharged to the motor generator 20. Thus, the battery discharge control process is ended and restarted after a predetermined period. When it is determined that the motor generator 20 is in a stopped state or being discharged (YES in step S11), the electronic control unit 30 proceeds to the process of step S12.

In step S12, the electronic control unit 30 calculates a reserve electric charge amount HEq related to the charged electric charge amount of the high-voltage battery 22. Specifically, the storage section of the electronic control unit 30 stores a target range of the charged electric charge amount of the high-voltage battery 22 in advance. The target range is, for example, a range from 40% to 70% with respect to the fully charged electric charge amount. The electronic control unit 30 subtracts the lower limit electric charge amount Lim1 of the target range (40% of the fully charged electric charge amount in the above example) from the charged electric charge amount of the high-voltage battery 22, which has been calculated based on the state information SHb from the sensor section 22a of the high-voltage battery 22. The electronic control unit 30 then sets the reserve electric charge amount HEq of the high-voltage battery 22 to the subtraction result. As described above, since the charged electric charge amount of the high-voltage battery 22 exceeds the lower limit electric charge amount Lim1, the reserve electric charge amount HEq has a positive value. As such, the lower limit electric charge amount Lim1 of the target range for the high-voltage battery 22 corresponds to a first lower limit electric charge amount, and the reserve electric charge amount HEq of the high-voltage battery 22 corresponds to a first reserve electric charge amount. After calculating the reserve electric charge amount HEq for the high-voltage battery 22, the process of the electronic control unit 30 proceeds to step S13.

In step S13, the electronic control unit 30 calculates a reserve electric charge amount LEq related to the charged electric charge amount of the low-voltage battery 24. Specifically, the storage section of the electronic control unit 30 stores a target range of the charged electric charge amount of the low-voltage battery 24 in advance. The target range is, for example, a range from 80% to 95% with respect to the fully charged electric charge amount. The electronic control unit 30 subtracts the lower limit electric charge amount Lim2 of the target range (80% of the fully charged electric charge amount in the above example) from the charged electric charge amount of the low-voltage battery 24, which has been calculated based on the state information SLb from the sensor section 24a of the low-voltage battery 24. The electronic control unit 30 then sets the reserve electric charge amount LEq of the low-voltage battery 24 to the subtraction result. As described above, since the charged electric charge amount of the low-voltage battery 24 exceeds the lower limit electric charge amount Lim2, the reserve electric charge amount LEq has a positive value. As such, the lower limit electric charge amount Lim2 of the target range for the low-voltage battery 24 corresponds to a second lower limit electric charge amount, and the reserve electric charge amount LEq of the low-voltage battery 24 corresponds to a second reserve electric charge amount. After calculating the reserve electric charge amount LEq for the low-voltage battery 24, the process of the electronic control unit 30 proceeds to step S14.

In step S14, the electronic control unit 30 calculates the difference between the calculated reserve electric charge amount HEq of the high-voltage battery 22 and the reserve electric charge amount LEq of the low-voltage battery 24. The electronic control unit 30 determines whether the absolute value of the calculated difference is greater than or equal to a predetermined threshold X. The threshold X is, for example, a few percent or less of the fully charged electric charge amount of the high-voltage battery 22 or the low-voltage battery 24. If it is determined that the absolute value of the difference between the reserve electric charge amounts is greater than or equal to the threshold X (YES in step S14), the process of the electronic control unit 30 proceeds to step S15.

In step S15, the electronic control unit 30 determines whether the reserve electric charge amount HEq of the high-voltage battery 22 is less than or equal to the reserve electric charge amount LEq of the low-voltage battery 24. If it is determined that the reserve electric charge amount HEq of the high-voltage battery 22 is greater than or equal to the reserve electric charge amount LEq of the low-voltage battery 24 (YES in step S15), the process of the electronic control unit 30 proceeds to step S16.

In step S16, the electronic control unit 30 controls the DC/DC converter 23 such that the high-voltage battery 22 is discharged to supply power to the motor generator 20 and the auxiliary devices 25. Specifically, the electronic control unit 30 causes the DC/DC converter 23 to function as a buck converter. Thereafter, the battery discharge control process by the electronic control unit 30 is ended and restarted after a predetermined period.

When it is determined in step S15 that the reserve electric charge amount HEq of the high-voltage battery 22 is less than the reserve electric charge amount LEq of the low-voltage battery 24 (NO in step S15), the process of the electronic control unit 30 proceeds to step S17.

In step S17, the electronic control unit 30 controls the DC/DC converter 23 such that the low-voltage battery 24 is discharged to supply power to the motor generator 20 and the auxiliary devices 25. Specifically, when it is necessary to supply power from the low-voltage battery 24 to the motor generator 20, the electronic control unit 30 causes the DC/DC converter 23 to function as a boost converter. When it is not necessary to supply power from the low-voltage battery 24 to the motor generator 20, the electronic control unit 30 stops the operation of the DC/DC converter 23 so that no power is supplied from the DC/DC converter 23 to the motor generator 20. Thereafter, the battery discharge control process by the electronic control unit 30 is ended and restarted after a predetermined period. The state in which the process in step S16 or step S17 is executed to discharge only one of the high-voltage battery 22 and the low-voltage battery 24 is referred to as a priority supply mode in the present embodiment.

When it is determined in step S14 that the absolute value of the difference between the reserve electric charge amount HEq of the high-voltage battery 22 and the reserve electric charge amount LEq of the low-voltage battery 24 is less than the threshold X (NO in step S14), the process of the electronic control unit 30 proceeds to step S20.

In step S20, based on the reserve electric charge amount HEq of the high-voltage battery 22 and the reserve electric charge amount LEq of the low-voltage battery 24, the electronic control unit 30 calculates the output direction (step up or step down) and the output voltage of the DC/DC converter 23. In the present embodiment, the electronic control unit 30 calculates the output direction (step up or step down) and the output voltage of the DC/DC converter 23 such that, if discharge from both of the high-voltage battery 22 and the low-voltage battery 24 continues, the point in time at which the charged electric charge amount of the high-voltage battery 22 reaches the lower limit electric charge amount Lim1 is at the same time as the point in time at which the charged electric charge amount of the low-voltage battery 24 reaches the lower limit electric charge amount Lim2. The lower limit electric charge amount Lim1 is allowed to be set to, for example, 40% of the fully charged electric charge amount of the high-voltage battery 22. The lower limit electric charge amount Lim2 is allowed to be set to, for example, 80% of the fully charged electric charge amount of the low-voltage battery 24. The "same time" in this description refers to the same time in calculation, and allows for time deviations due to detection errors of sensor sections and the control delay of the DC/DC converter 23.

As described above, in order for the charged electric charge amounts of the batteries to reach the lower limit electric charge amounts at the same time, the ratio of the discharge current HI of the high-voltage battery 22 to the discharge current LI of the low-voltage battery 24 is ideally the same as the ratio of the reserve electric charge amount HEq of the high-voltage battery 22 to the reserve electric charge amount LEq for the low-voltage battery 24. That is, the relation of HI:LI=HEq:LEq is ideally satisfied. Then, when this equation is converted into the relational equation related to the discharge current HI of the high-voltage battery 22, the equation HI=LI(HEq/LEq) is obtained. Thus, based on signals from the sensor section 22a of the high-voltage battery 22 and the sensor section 24a of the low-voltage battery 24, the electronic control unit 30 controls the DC/DC converter 23 such that the discharge current HI of the high-voltage battery 22 satisfies the above relational equation. In the present embodiment, the state in which both of the high-voltage battery 22 and the low-voltage battery 24 are discharged in this manner is referred to as an equal supply mode.

In step S20, when the DC/DC converter 23 is controlled as described above, the DC/DC converter 23 may function as a boost converter or as a buck converter. For example, when the required current for the motor generator 20 is greater than the discharge current HI of the high-voltage battery 22, the DC/DC converter 23 functions as a boost converter. Also, when the required current for the motor generator 20 is less than the discharge current HI of the high-voltage battery 22, the DC/DC converter 23 functions as a buck converter.

When the DC/DC converter 23 is controlled as described above, the process of the electronic control unit 30 proceeds to step S21. In step S21, it is determined whether the reserve electric charge amount HEq of the high-voltage battery 22 is less than or equal to zero and whether the reserve electric charge amount LEq of the low voltage battery 24 is less than or equal to zero. In the present embodiment, the point in time at which the charged electric charge amount of the high-voltage battery 22 becomes the lower limit electric charge amount Lim1 is the same time as the point in time at which the charged electric charge amount of the low voltage battery 24 becomes the lower limit electric charge amount Lim2. Therefore, it is determined whether the reserve electric charge amount HEq of the high-voltage battery 22 and the reserve electric charge amount LEq of the low-voltage battery 24 are both greater than zero, or less than or equal to zero. If the reserve electric charge amount HEq of the high-voltage battery 22 and the reserve electric charge amount LEq of the low-voltage battery 24 are both greater than zero (NO in step S21), the battery discharge control process by the electronic control unit 30 is ended and restarted after a predetermined period. If it is determined that the reserve electric charge amount HEq of the high-voltage battery 22 and the reserve electric charge amount LEq of the low-voltage battery 24 are both less than or equal to zero, the process of the electronic control unit 30 proceeds to step S22.

In step S22, the electronic control unit 30 makes a power generation request to the motor generator 20. The power generation request is made, for example, by switching the voltage level of a signal (flag) indicating the presence or absence of a power generation request from a low level to a high level or from a high level to a low level. Even if a power generation request is made in this manner, power generation may not be started in the motor generator 20 if other conditions for generating power in the motor generator 20 are not satisfied. After step S22, the battery discharge control process by the electronic control unit 30 is ended.

After step S22, the charged electric charge amount of the high-voltage battery 22 is less than the lower limit electric charge amount Lim1, and the charged electric charge amount of the low-voltage battery 24 is less than the lower limit electric charge amount Lim2. Therefore, the process of step S11 is not started until the high-voltage battery 22 and the low-voltage battery 24 are both charged and the charged electric charge amounts of both batteries 22, 24 exceed the lower limit electric charge amounts.

The operation and advantages of the present embodiment will now be described.

First, a state in which the motor generator 20 is functioning as a motor and assisting the operation of the engine 10 will be described. In this example, it is assumed that the motor generator 20 discharges (consumes) a certain amount of power for simplification of the explanation. Also, the power consumption of the auxiliary devices 25 is assumed to be zero.

When the motor generator 20 is functioning as a motor and is discharging, and the charged electric charge amount of either one of the high-voltage battery 22 and the low-voltage battery 24 greatly exceeds the lower limit electric charge amount, the batteries 22, 24 are discharged in the priority supply mode, in which power is supplied to the motor generator from one of the batteries 22, 24. For example, in the example shown in FIG. 3, the reserve electric charge amount HEq of the high-voltage battery 22 is fairly greater than the reserve electric charge amount LEq of the low-voltage battery 24 at the point in time of the start of discharge. Therefore, the high-voltage battery 22 is discharged to supply power to the motor generator 20.

As the high-voltage battery 22 continues to be discharged, the charged electric charge amount of the high-voltage battery 22 gradually decreases, and the reserve electric charge amount HEq in the high-voltage battery 22 also gradually decreases. After a point in time T1, at which the absolute value of the difference between the reserve electric charge amount HEq of the high-voltage battery 22 and the reserve electric charge amount LEq of the low-voltage battery 24 becomes less than threshold X, the high-voltage battery 22 and the low-voltage battery 24 are discharged in the equal supply mode in which the batteries 22, 24 are both discharged. In the equal supply mode, the low-voltage battery 24 takes over part of the discharge power discharged by the high-voltage battery 22 up to the point in time T1. Thus, the decrease rate of the charged electric charge amount of the high-voltage battery 22 in the equal supply mode is slower than that in the priority supply mode. That is, the slope of the graph becomes gentle after the point in time T1 in FIG. 3. Therefore, when the equal supply mode is executed, a point in time T2 at which the reserve electric charge amount HEq of the high-voltage battery 22 becomes zero is later than a point in time T3 at which the reserve electric charge amount HEq of the high-voltage battery 22 becomes zero after the high-voltage battery 22 continues to be discharged in the priority supply mode after the point in time T1. As a result, the period during which the motor generator 20 can assist the operation of the engine 10 is extended by the amount of the difference between the point in time T3 and the point in time T2. Thus, the fuel economy is improved by extending the time in which the motor generator 20 assists operation of the engine 10.

Figure 3:
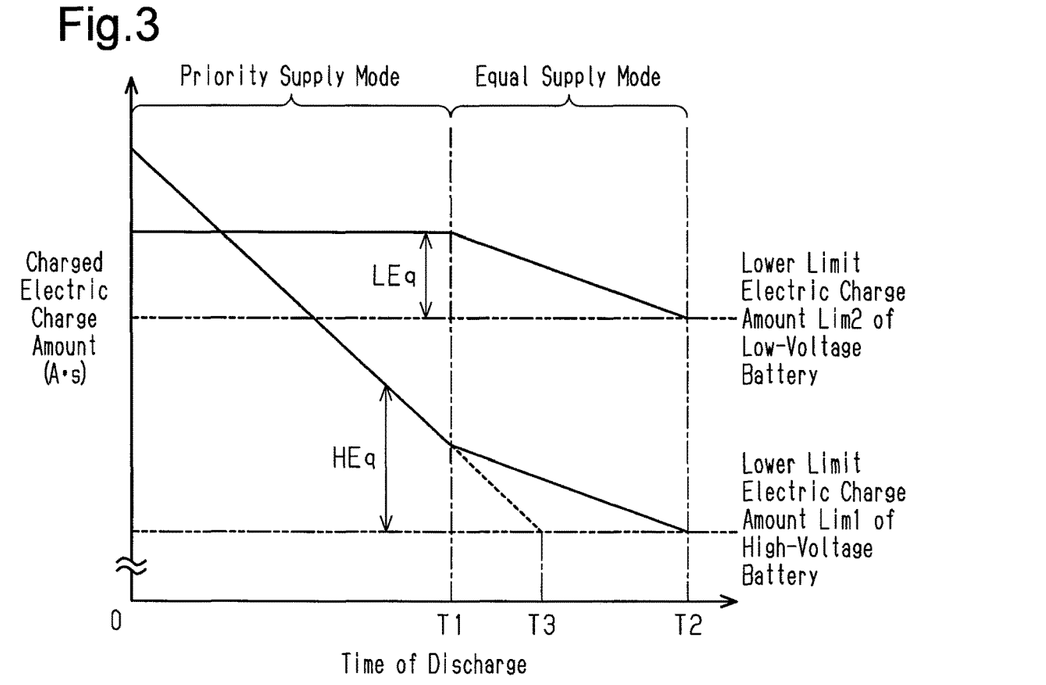
FIG. 3 is a diagram showing changes in the charged electric charge amounts of the batteries when the motor generator performs engine assist.

Also, when discharge from the high-voltage battery 22 in the priority supply mode is continued without discharging in the equal supply mode, the charged electric charge amount of the high-voltage battery 22 reaches the lower limit of the electric charge Lim1. Thereafter, when the generator 20 generates power, the high-voltage battery 22 can be charged, for example, until the charged electric charge amount is increased from the lower limit electric charge amount Lim1 to the upper limit electric charge amount, for example, 70% of the fully charged electric charge amount in the target range.

However, in the first place, when the fully charged electric charge amount of the high-voltage battery 22 is small, it may not be possible to charge the high-voltage battery 22 with much power even if charging is performed until the charged electric charge amount of the high-voltage battery 22 is increased from the lower limit electric charge amount Lim1 to the upper limit electric charge amount in the target range. If the charged electric charge amount of the high-voltage battery 22 reaches the upper limit electric charge amount of the target range, the power generation is stopped or generated power is consumed wastefully even though the motor generator 20 can generate power. This diminishes the improvement of the fuel economy.

In this respect, in the above-described embodiment, the charged electric charge amount of the low voltage battery 24 at the point in time T2 at which the charged electric charge amount of the high-voltage battery 22 reaches the lower limit electric charge amount Lim1 through discharging in the equal supply mode is lower than the charged electric charge amount of the low voltage battery 24 at the point in time T1 at which the equal supply mode is started. The amount of decrease in the charged electric charge amount can be used as the electric charge amount that can be used for charging when the motor generator 20 generates power. In the above-described embodiment, execution of the equal supply mode allows the low-voltage battery 24 to be effectively used as the supply destination of the power generated by the motor generator 20.

In the above-described embodiment, since the high-voltage battery 22 is a lithium ion battery, and low-voltage battery 24 is a lead-acid battery, the types of the batteries 22 and 24 are different. Also, since the high-voltage battery 22 mainly supplies power to the motor generator 20, the target range of the charged electric charge amount is relatively large. Therefore, the high-voltage battery 22 generally has a greater electric charge amount available within the target range of the charged electric charge amount than the low-voltage battery 24. That is, the electric charge amount that can be used is different between the high-voltage battery 22 and the low-voltage battery 24. However, if the same current is output from both batteries 22 and 24 in the equal supply mode, the charged electric charge amount of the low-voltage battery 24 reaches the lower limit electric charge amount Lim2 sooner than the charged electric charge amount of the high-voltage battery 22 reaches the lower limit electric charge amount Lim1. In some cases, the charged electric charge amount of the low-voltage battery 24 may fall below the lower limit of electric charge Lim2.

With the above-described embodiment, the discharge current HI from the high-voltage battery 22 is calculated in accordance with the ratio of the reserve electric charge amount HEq of the high-voltage battery 22 to the reserve electric charge amount LEq of the low-voltage battery 24 in the equal supply mode. Specifically, based on the comparison result between the reserve electric charge amount HEq and the reserve electric charge amount LEq, the discharge current HI from the high-voltage battery 22 is increased as the reserve electric charge amount HEq is increased. This prevents the charged electric charge amount of only one of the high-voltage battery 22 and the low-voltage battery 24 from reaching the lower limit of the target range excessively quickly.

Moreover, in the above-described embodiment, when the discharge in the equal supply mode is continued, the point in time T2 at which the charged electric charge amount of the high-voltage battery 22 reaches the lower limit electric charge amount Lim1 is at the same time as the point in time T2 at which the charged electric charge amount of the low-voltage battery 24 reaches the lower limit electric charge amount Lim2. Therefore, almost all the reserve electric charge amount LEq of the low-voltage battery 24 at the point in time T1, at which the equal supply mode is started, can be used as the electric charge amount that can charge the charging power of the motor generator 20 thereafter. That is, it is possible to maximize the total amount of power with which the high-voltage battery 22 and the low-voltage battery 24 can be charged by the motor generator 20. This allows the power generated by the motor generator 20 to be used more effectively.

In the above-described embodiment, if the absolute value of the difference between the reserve electric charge amount HEq of the high-voltage battery 22 and the reserve electric charge amount LEq of the low-voltage battery 24 is greater than or equal to the threshold X, discharge of the batteries 22 and 24 is performed in the priority supply mode, in which one of the batteries 22 and 24 that has the greater reserve electric charge amount is discharged. This prevents the charged electric charge amounts of the batteries 22 and 24 from becoming excessively low due to discharge from the battery 22, 24 having the smaller reserve electric charge amount.

Next, a state will be described in which, for example, the engine 10 is temporarily stopped (idle reduction) while waiting for a traffic light to change, and the motor generator 20 is not functioning as either a motor or a generator, that is, the motor generator 20 is in a stopped state. In this example, it is assumed that the auxiliary devices 25 discharge (consume) a certain amount of power for simplification of the explanation.

Figure 4:
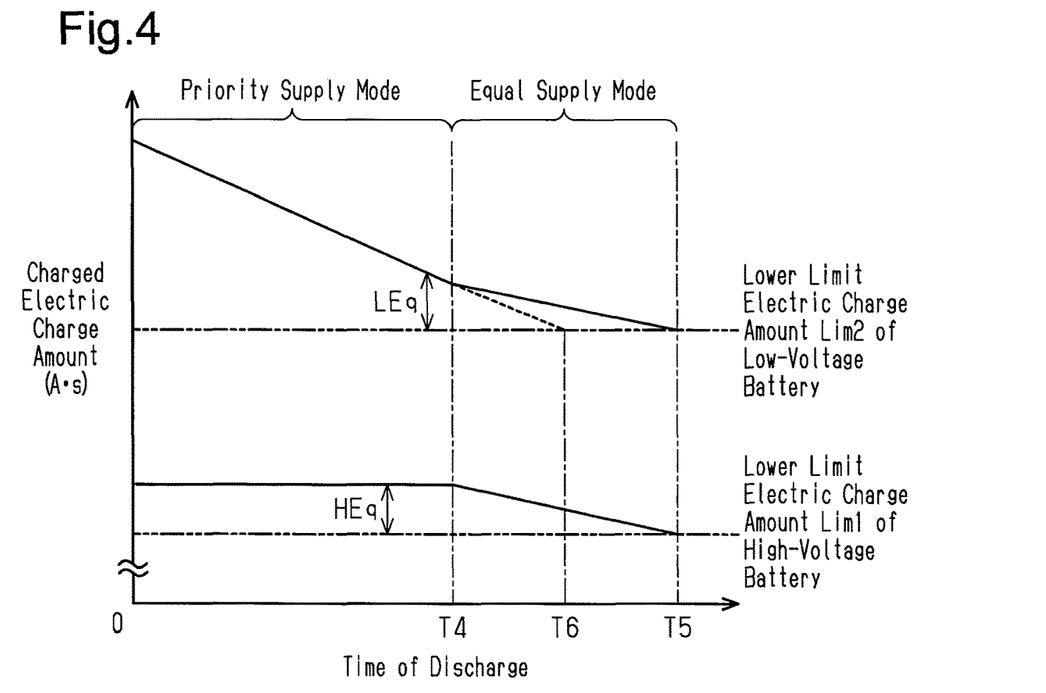
FIG. 4 is a diagram showing changes in the charged electric charge amounts of the batteries when the vehicle is in a stopped state.

For example, after the motor generator 20 assists operation of the engine 10, the charged electric charge amount of the high-voltage battery 22 is in the vicinity of the lower limit of the electric charge Lim1 in some cases. In this case, the reserve electric charge amount LEq of the low-voltage battery 24 may be greater than the reserve electric charge amount HEq of the high-voltage battery 22 as shown in FIG. 4. In this case, power is supplied to the auxiliary devices 25 in the priority supply mode in which low-voltage battery 24 is discharged.

As the low-voltage battery 24 continues to be discharged, the charged electric charge amount of the low-voltage battery 24 gradually decreases, and the reserve electric charge amount LEq in the low-voltage battery 24 also gradually decreases. After a point in time T4, at which the absolute value of the difference between the reserve electric charge amount LEq of the low-voltage battery 24 and the reserve electric charge amount HEq of the high-voltage battery 22 becomes less than threshold X, discharge of the low-voltage battery 24 and the high-voltage battery 22 is performed in the equal supply mode, in which the batteries 22, 24 are both discharged. In the equal supply mode, the high-voltage battery 22 takes over part of the discharge power discharged by the low-voltage battery 24 up to the point in time T4. Therefore, the decrease rate of the charged electric charge amount of the low-voltage battery 24 in the equal supply mode is slower than that in the priority supply mode. That is, the slope of the graph becomes gentle after the point in time T4 in FIG. 4. Therefore, when the equal supply mode is executed, a point in time T5 at which the reserve electric charge amount LEq of the low-voltage battery 24 becomes zero is later than a point in time T6 at which the reserve electric charge amount LEq of the low-voltage battery 24 becomes zero after the low-voltage battery 24 continues to be discharged in the priority supply mode after the point in time T4. This extends the period in which power can be stably supplied to the auxiliary devices 25.

In the above-described embodiment, when the absolute value of the difference between the reserve electric charge amount LEq of the low-voltage battery 24 and the reserve electric charge amount HEq of the high-voltage battery 22 is greater than or equal to the threshold X, the high-voltage battery 22 is not discharged, and the reserve electric charge amount HEq of the high-voltage battery 22 is maintained. Therefore, when restarting the engine 10 using the motor generator 20, the reserve electric charge amount HEq of the high-voltage battery 22 can be used as the power required to restart the engine 10.

The above-described embodiment may be modified as follows. The present embodiment and the following modifications can be combined as long as the combined modifications remain technically consistent with each other.

In the above-described embodiment, the electronic control unit 30, which controls the entire hybrid system in a centralized manner, executes a series of discharge control processes. However, the controller that controls the engine 10 and the controller that executes the discharge control processes may be separate processing circuits (computers).

The configuration by which the engine 10 and the motor generator 20 are drivably coupled to each other is not limited to that in the above-described embodiment. Also, in addition to the first pulley 12, the transmission belt 13, and the second pulley 14, a speed reduction mechanism including gears or a mechanism such as a clutch, which engages or disengages the power transmission path, may be arranged between the engine 10 and the motor generator 20.

The output voltages of the high-voltage battery 22 and the low-voltage battery 24 are arbitrary. Also, the output voltage of the low-voltage battery 24 does not necessarily have to be lower than the output voltage of the high-voltage battery 22, and the output voltages of the batteries 22 and 24 may be the same.

The types of the high-voltage battery 22 and the low-voltage battery 24 are not limited to the examples in the above-described embodiment. As the high-voltage battery 22 and the low-voltage battery 24, in addition to a lithium-ion battery and a lead-acid battery, for example, a nickel metal hydride battery, a NAS battery, and a solid-state battery may be employed.

A motor generator that mainly assists the traveling torque of the engine 10 and a motor generator that generates power mainly by torque from the engine 10 may be provided separately.

The charged electric charge amounts of the high-voltage battery 22 and the low-voltage battery 24 do not necessarily need to be calculated in ampere-seconds (current·time). When the fully charged electric charge amount of the high-voltage battery 22 and the fully charged electric charge amount of the low-voltage battery 24 are the same, the ratio of the charged electric charge amount to the fully charged electric charge amount (state of charge (SOC)) may be used as a parameter indicating the charged electric charge amount.

As the conditions for performing discharge of the high-voltage battery 22 and the low-voltage battery 24, other conditions may be added to the condition that the motor generator 20 is in a stopped state or discharging. For example, the conditions may include a condition that the temperatures of the high-voltage battery 22 and the low-voltage battery 24 are within an appropriate range.

In the above-described embodiment, the battery with a large reserve electric charge amount is discharged. However, the present disclosure is not limited to this. For example, in the priority supply mode, the DC/DC converter 23 may be stopped, and power may be supplied to the motor generator 20 from the high-voltage battery 22, and power may be supplied to the auxiliary devices 25 from the low-voltage battery 24.

The discharge current HI of the high-voltage battery 22 and the discharge current LI of the low-voltage battery 24 in the equal supply mode of the above-described embodiment may be changed as necessary. Instead of determining the discharge current HI and the discharge current LI based on the reserve electric charge amount HEq of the high-voltage battery 22 and the reserve electric charge amount LEq of the low-voltage battery 24, the ratio of the discharge current HI to the discharge current LI may be set to a fixed value. In general, the high-voltage battery 22 has more electric charge amount available within the target range and has more electric charge amount that can be output than the low-voltage battery 24. Therefore, in a case in which the ratio of the discharge current HI to the discharge current LI is set to a fixed value, setting the discharge current HI to be greater than the discharge current LI prevents the charged electric charge amount of the low-voltage battery 24 from being lowered excessively quickly to the lower limit electric charge amount Lim2 of the target range. Depending on the manner of setting the discharge current HI of the high-voltage battery 22 and the discharge current LI of the low-voltage battery 24, the point in time at which the charged electric charge amount of the high-voltage battery 22 reaches the lower limit electric charge amount Lim1 deviates from the point in time at which the charged electric charge amount of the low-voltage battery 24 reaches the lower limit electric charge amount Lim2. In this case, step S11 of the discharge control process is not started if the charged electric charge amount of either one of the batteries 22 and 24 reaches the lower limit electric charge amounts Lim1, Lim2.

In the equal supply mode of the above-described embodiment, the high-voltage battery 22 and the low-voltage battery 24 are discharged simultaneously. However, the high-voltage battery 22 and the low-voltage battery 24 may be discharged alternately and repeatedly. For example, in the example shown in FIG. 5, the low-voltage battery 24 is discharged for a certain period from a point in time T7, at which the equal supply mode starts. Then, the high-voltage battery 22 is discharged for a certain period P2 thereafter. By alternately repeating discharge of the low-voltage battery 24 and the discharge of the high-voltage battery 22 in this way, the charged electric charge amounts of the low-voltage battery 24 and the high-voltage battery 22 decrease. In this modification, the point in time at which the charged electric charge amount of the high-voltage battery 22 reaches the lower limit electric charge amount Lim1 is not at the same time as the point in time at which the charged electric charge amount of the low voltage battery 24 reaches the lower limit electric charge amount Lim2. Therefore, for example, in the example shown in FIG. 5, the charged electric charge amount of the low-voltage battery 24 reaches the lower limit of the electric charge Lim2 before a point in time T8, at which the charged electric charge amount of the high-voltage battery 22 reaches the lower limit electric charge amount Lim1. In this manner, step S11 of the discharge control process is not started if the charged electric charge amount of the low-voltage battery 24 reaches the lower limit electric charge amount Lim2.

In the above-described example, when the equal supply mode is executed once in a state in which the charged electric charge amount of the low-voltage battery 24 is allowed to be slightly lower than the lower limit electric charge amount Lim2, the starting condition of step S11 of the discharge control process simply needs to be changed to a condition that the charged electric charge amount of either one of the batteries 22 and 24 exceeds the lower limit electric charge amounts Lim1, Lim2. In this case, the equal supply mode is continued, so that the charged electric charge amount of the high-voltage battery 22 falls below the lower limit electric charge amount Lim1 and the charged electric charge amount of the low-voltage battery 24 falls below the lower limit electric charge amount Lim2 at the point in time T8, and the discharge in the equal supply mode ends.

Figure 5:
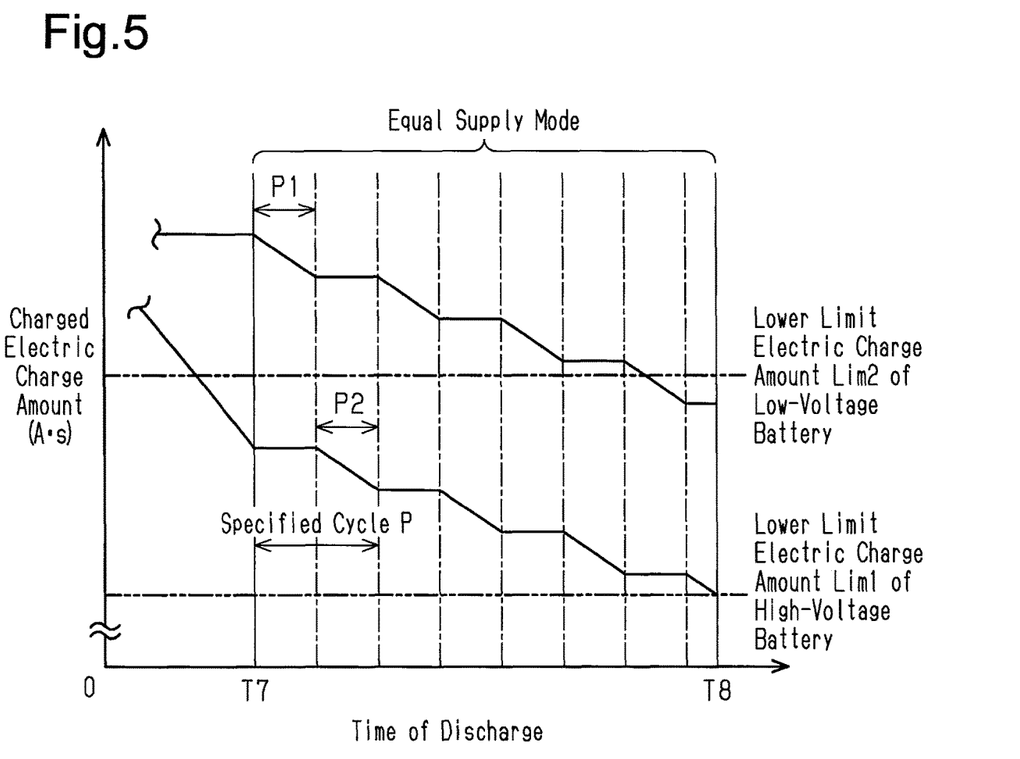
FIG. 5 is a diagram showing changes in the charged electric charge amounts of the batteries in an equal supply mode according to a modification.

When discharge of the high-voltage battery 22 and discharge of the low-voltage battery 24 are alternately repeated in the equal supply mode, the ratio of the length of a single discharge of the high-voltage battery 22 to the length of a single discharge of the low-voltage battery 24 may be variable. For example, as shown in FIG. 5, the low-voltage battery 24 is discharged for a period P1 and the high-voltage battery 22 is discharged for a period P2 within a certain specified cycle P. In this example, period P1+period P2=specified cycle P. The ratio of the period P1 to the period P2 is determined in accordance with the ratio of the reserve electric charge amount LEq of the low-voltage battery 24 to the reserve electric charge amount HEq of the high-voltage battery 22. For example, the ratio of discharge may be determined such that the following equation is satisfied, period P1: period P2=reserve electric charge amount LEq: reserve electric charge amount HEq. In this case, the deviation between the point in time at which the charged electric charge amount of the high-voltage battery 22 reaches the lower limit electric charge amount Lim1 and the point in time at which the charged electric charge amount of the low-voltage battery 24 reaches the lower limit electric charge amount Lim2 becomes smaller.

In the equal supply mode, the DC/DC converter 23 may be controlled such that one of the high-voltage battery 22 and the low-voltage battery 24 that has the lower temperature is discharged. Generally, a battery being discharged generates heat and its temperature rises, while the temperature of a battery that is not being discharged decreases. Therefore, in the case of the equal supply mode of this modification, the high-voltage battery 22 and the low-voltage battery 24 are discharged alternately.

In the above-described embodiment, the electronic control unit 30 is not limited to a device that includes a CPU and a ROM and executes software processing. For example, at least part of the processes executed by the software in the above-illustrated embodiments may be executed by hardware circuits dedicated to executing these processes (such as ASIC). That is, the electronic control unit 30 may be modified as long as it has any one of the following configurations (a) to (c). (a) A configuration including a processor that executes all of the above-described processes according to programs and a program storage device such as a ROM that stores the programs. (b) A configuration including a processor and a program storage device that execute part of the above-described processes according to the programs and a dedicated hardware circuit that executes the remaining processes. (c) A configuration including a dedicated hardware circuit that executes all of the above-described processes. A plurality of software processing circuits each including a processor and a program storage device and a plurality of dedicated hardware circuits may be provided. That is, the above processes may be executed in any manner as long as the processes are executed by processing circuitry that includes at least one of a set of one or more software processing circuits and a set of one or more dedicated hardware circuits.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. An electronic controller configured to control a hybrid system, wherein the hybrid system includes:
   an engine as a drive source,
   a motor generator that is drivably coupled to the engine,
   a first battery that receives power front the motor generator, and
   a second battery that is connected to the motor generator and the first battery via a bidirectional DC/DC converter,
   wherein the electronic controller includes circuitry configured to:
      calculate a charged electric charge amount of the first battery and a charged electric charge amount of the second battery; and
      control the DC/DC converter so as to discharge at least one of the first battery and the second battery when conditions are met, one of the conditions being that the motor generator is in a stopped state or the motor generator is discharging,
   wherein the circuitry is further configured to calculate an absolute value of a difference between a first reserve electric charge amount and a second reserve electric charge amount, wherein the first reserve electric charge amount is a value obtained by subtracting a predetermined first lower limit electric charge amount from the charged electric charge amount of the first battery, and the second reserve electric charge amount is a value obtained by subtracting a predetermined second lower limit electric charge amount from the charged electric charge amount of the second battery,
   wherein the circuitry is further configured to control the DC/DC converter to discharge both of the first battery and the second battery when:
      the first reserve electric charge amount has a positive value,
      the second reserve electric charge amount has a positive value, and
      the absolute value of the difference between the first reserve electric charge amount and the second reserve electric charge amount is less than a predetermined threshold, and
   wherein the circuitry is further configured to control the DC/DC converter to discharge one of the first and second batteries that has a greater reserve electric charge amount, and not discharge one of the first and second batteries that has a smaller reserve electric charge amount when:
      the first reserve electric charge amount has a positive value,
      the second reserve electric charge amount has a positive value, and
      the absolute value of the difference between the first reserve electric charge amount and the second reserve electric charge amount is equal to or greater than the predetermined threshold.

2. The electronic controller according to claim 1, wherein the circuitry is further configured to control the DC/DC converter based on a comparison between the first reserve electric charge amount and the second reserve electric charge amount such that more power is discharged from one of the first and second batteries that has more electric charge amount that can be output.

3. The electronic batter controller according to claim 1, wherein the circuitry is further configured to control the DC/DC converter such that, if discharge from both of the first battery and the second battery is continued, a point in time at which the charged electric charge amount of the first battery reaches the first lower limit electric charge amount is at the same time as a point in time at which the charged electric charge amount of the second battery reaches the second lower limit electric charge amount.

4. An electronic controller configured to control a hybrid system, wherein the hybrid system includes:
   an engine as a drive source,
   a motor generator that is drivably coupled to the engine,
   a first battery that receives power from the motor generator, and
   a second battery that is connected to the motor generator and the first battery via a bidirectional DC/DC converter,
   wherein the electronic controller includes circuitry configured to:
      calculate a charged electric charge amount of the first battery and a charged electric charge amount of the second battery; and
      control the DC/DC converter so as to discharge at least one of the first battery and the second battery when conditions are met, one of the conditions being that the motor generator is in a stopped state or the motor generator is discharging,
   wherein the circuitry is further configured to calculate an absolute value of a difference between a first reserve electric charge amount and a second reserve electric charge amount, wherein the first reserve electric charge amount is a value obtained by subtracting a predetermined first lower limit electric charge amount from the charged electric charge amount of the first battery, and the second reserve electric charge amount is a value obtained by subtracting a predetermine second lower limit electric charge amount from the charged electric charge amount of the second battery,
   wherein the circuitry is further is configured to control the DC/DC converter to alternately discharge the first battery and the second battery when:
      the first reserve electric charge amount has a positive value,
      the second reserve electric charge amount has a positive value, and
      the absolute value of the difference between the first reserve electric charge amount and the second reserve electric charge amount is less than a predetermined threshold, and
   wherein the circuitry is further configured to control the DC/DC converter to discharge one of the first and second batteries that has a greater reserve electric charge amount, and not discharge one of the first and second batteries that has a smaller reserve electric charge amount when:
      the first reserve electric charge amount has a positive value,
      the second reserve electric charge amount has a positive value, and
      the absolute value of the difference between the first reserve electric charge amount and the second reserve electric charge amount is equal to or greater than the predetermined threshold.

* * * * *